United States Patent
Lin

(10) Patent No.: US 9,934,829 B1
(45) Date of Patent: Apr. 3, 2018

(54) MEMORY DEVICE

(71) Applicant: Winbond Electronics Corp., Taichung (TW)

(72) Inventor: Chi-Cheng Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 4 days.

(21) Appl. No.: 15/408,387

(22) Filed: Jan. 17, 2017

(51) Int. Cl.
  *G11C 7/10* (2006.01)
  *G11C 8/12* (2006.01)

(52) U.S. Cl.
  CPC . *G11C 7/10* (2013.01); *G11C 8/12* (2013.01)

(58) Field of Classification Search
  CPC .................................. G11C 8/12; G11C 7/10
  USPC ....................................... 365/230.03, 230.06
  See application file for complete search history.

(56) References Cited

U.S. PATENT DOCUMENTS

| | | | | |
|---|---|---|---|---|
| 2005/0082664 A1* | 4/2005 | Funaba | ............... | H01L 23/544 257/724 |
| 2008/0074930 A1* | 3/2008 | Kanda | ............... | G11O 5/02 365/185.17 |
| 2009/0196093 A1* | 8/2009 | Happ | ............... | G11C 5/02 365/163 |
| 2009/0196109 A1* | 8/2009 | Walker | ............... | G11C 5/066 365/189.07 |
| 2017/0125119 A1* | 5/2017 | Loh | ............... | G11C 17/16 |

FOREIGN PATENT DOCUMENTS

TW          201603242         1/2016

* cited by examiner

*Primary Examiner* — Hoai V Ho
*Assistant Examiner* — Jay Radke
(74) *Attorney, Agent, or Firm* — JCIPRNET

(57) ABSTRACT

A memory device including a plurality of pins and a plurality of memory dies is provided. Each of the memory dies is coupled to the pins, and each of the memory dies includes a matching circuit and a core circuit. During a course of power-on, according to voltage levels of data pins or control pins, the matching circuit may be selected automatically an enabled one of memory dies. When the core enabling signal is enabled, the core circuit starts operating, and when the core enabling signal is disabled, the core circuit stops operating. When the core circuit of one of the memory dies is operating, the core circuits of the rest of the memory dies stop operating.

11 Claims, 2 Drawing Sheets

MEMORY DEVICE

FIELD OF THE INVENTION

The invention relates to a memory device, and more particularly, to a memory device having a plurality of memory dies.

DESCRIPTION OF RELATED ART

With the development of the semiconductor manufacturing process, an area occupied by an integrated circuit (IC) is significantly reduced, and the serial peripheral interface (SPI) protocol has become a mainstream communication protocol, e.g., the low pin count (LPC) interface specification. To enjoy the packaging advantages resulting from the LPC, several dies or ICs may be vertically stacked together in response to the demand for increasing capacity or for backup. However, to select an individual die or IC from among those stacked together, the chip selecting (CS) pins of each die or IC need be independently controlled. That is, the number of pins in the stacked ICs using LPC is greater than 8, and the 8-pin packaging method cannot be applied. Hence, more pins are required, e.g., 16 or 24 pins; thereby, the costs of the ICs cannot be lowered down.

SUMMARY OF THE INVENTION

The invention provides a memory device in which it can be not required to add the chip selecting pins, and the hardware costs of the memory device can be lowered down.

In an embodiment of the invention, a memory device including a plurality of pins and a plurality of memory dies is provided. Each of the memory dies is coupled to the pins, and each of the memory dies includes a matching circuit and a core circuit. The matching circuit of each die is coupled to pins and provides a core enabling signal based on a voltage level of at least one of the pins to select an enabled one of memory dies during power-on. The core circuit is coupled to the pins and the matching circuit for receiving the core enabling signal. When the core enabling signal is enabled, the core circuit starts operating, and when the core enabling signal is disabled, the core circuit stops operating. When the core circuit of one of the memory dies is operating, the core circuits of the rest of the memory dies stop operating.

In view of the above, the matching circuit in the memory device described in the embodiments of the invention provides the core enabling signal according to the voltage levels of the pins, so as to enable the core circuit in one of the memory dies. Thereby, the memory device can automatically activate one of the core circuits in no need of adding any pin.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
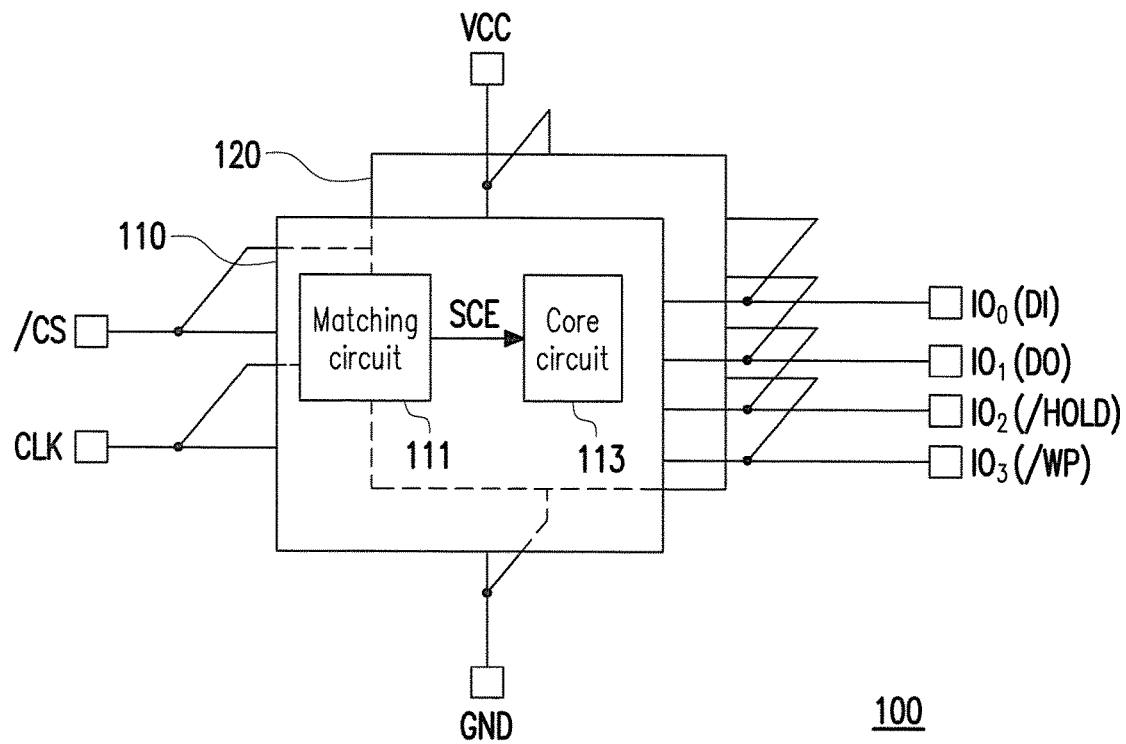
FIG. 1 is a schematic diagram illustrating a system of a memory device according to an embodiment of the invention.

FIG. 1 is a schematic diagram illustrating a system of a memory device according to an embodiment of the invention. With reference to FIG. 1, in the present embodiment, the memory device 100 includes a plurality of pins and a plurality of memory dies (e.g., 110 and 120). Here, it is assumed that the pins comprise a power pin VCC, a ground pin GND, a clock pin CLK, a chip selecting pin /CS, a first input/output (I/O) pin 100, a second I/O pin IO1, a third I/O pin IO2, and a fourth I/O pin IO3. The memory dies are vertically stacked, for instance.

In the present embodiment, each of the memory dies (e.g., 110 and 120) is coupled to the pins, and each of the memory dies (e.g., 110 and 120) includes or is equipped with a matching circuit (e.g., 111) and a core circuit (e.g., 113). The core circuit (e.g., 113) has a memory cell array (not shown) and a corresponding read-write circuit (not shown), for instance; however, the invention should not be limited thereto.

The matching circuit (e.g., 111) is coupled to the pins and the core circuit (e.g., 113) in the same memory die (e.g., 110 or 120), and the matching circuit (e.g., 111) provides a core enabling signal SCE to the core circuit (e.g., 113) in the same memory die (e.g., 110 or 120) based on the voltage level of at least one of the pins, so as to determine whether the core circuit (e.g., 113) is activated or not. To be specific, when the core enabling signal SCE is enabled, the core circuit (e.g., 113) starts operating, and when the core enabling signal SCE is disabled, the core circuit (e.g., 113) is not activated, i.e., the core circuit (e.g., 113) stops operating.

In the present embodiment, only the core circuit (e.g., 113) in one memory die (e.g., 110 or 120) is in operation. That is, when the core circuit of one of the memory dies (e.g., 110 or 120) is operating, the core circuit of the rest of the memory dies (e.g., 110 or 120) stops operating. Namely, at one time, only one matching circuit (e.g., 111) in all of the memory dies (e.g., 110 and 120) provides the enabled core enabling signal SCE, while the other matching circuits provides the disabled core enabling signal SCE.

In the present embodiment, the matching circuit (e.g., 111) detects the voltage level at a certain time point (or during a certain time period) after the memory device 100 is powered on, so as to set up the core enabling signal SCE provided by the matching circuit (e.g., 111). For instance, when the voltage level of the power pin VCC is raised to the trigger voltage level (e.g., 0.7 times the power voltage), the matching circuit (e.g., 111) detects the current voltage levels of the pins of the memory device 100, so as to provide the core enabling signal SCE; alternatively, after the voltage level of the power pin VCC is raised to the trigger voltage level for a predetermined period of time, the matching circuit (e.g., 111) detects the current voltage levels of the pins of the memory device 100, so as to provide the core enabling signal SCE.

As provided above, whether the system is powered on is determined according to the voltage level of the power pin VCC; however, in another embodiment, whether the system is powered on may be determined according to the voltage level of a reset pin (not shown). This may be done in view of the actual circuit design and should not be construed as a limitation to the invention.

Generally, two memory dies (e.g., 110 and 120) may be selected by one bit; namely, the memory dies (e.g., 110 and 120) may be selected according to the voltage level of one single pin. In other words, if the number of the memory dies (e.g., 110 and 120) is 2, the matching circuits (e.g., 111) of all of the memory dies (e.g., 110 and 120) provide the core enabling signal SCE based on the voltage level of one of the first I/O pin $IO_0$, the second I/O pin $IO_1$, the third I/O pin $IO_2$, and the fourth I/O pin $IO_3$. After the core enabling signal SCE is provided, the matching circuit (e.g., 111) is automatically switched off (i.e., the matching circuit stops the detection) until the system is powered on again.

In an embodiment of the invention, the I/O pins may perform the control function in a certain mode. For instance, the first I/O pin $IO_0$ may serve as a data input pin DI, the second I/O pin $IO_1$ may serve as a data output pin DO, the third I/O pin $IO_2$ may serve as a status locking pin /HOLD, and the fourth I/O pin $IO_3$ may serve as a writing protection pin /WP, which may be determined according to actual circuit design and should not be construed as limitations to the invention.

Figure 2:
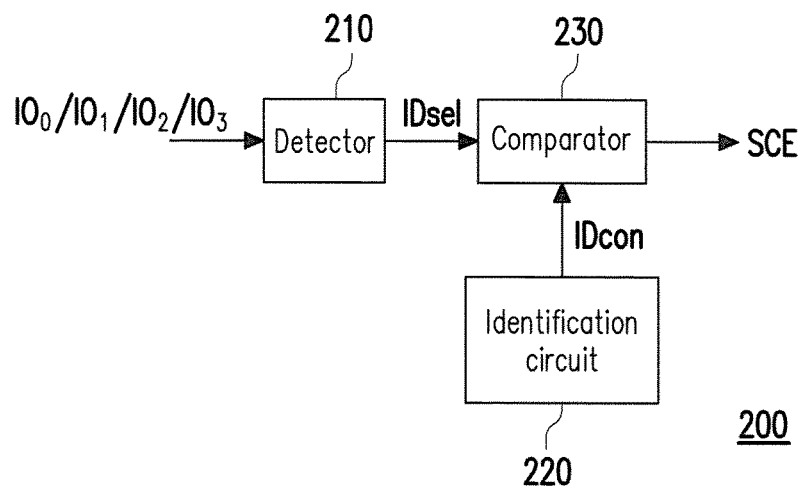
FIG. 2 is a schematic diagram illustrating a system of a matching circuit according to an embodiment of the invention.

FIG. 2 is a schematic diagram illustrating a system of a matching circuit according to an embodiment of the invention. With reference to FIG. 1 and FIG. 2, the matching circuit 200 is an example of the matching circuit 111, and the invention should not be limited thereto. According to the present embodiment, the matching circuit 200 includes a detector 210, an identification circuit 220, and a comparator 230.

The detector 210 is coupled to the pins on the memory device (e.g., 100), so as to detect the voltage levels of the pins and provide an identification selecting signal IDsel based on the voltage levels of the pins. The identification circuit 220 is configured to provide an identification setting signal IDcon that is predetermined and remains unchanged, and the number of bits of the identification setting signal IDcon is equal to the number of bits of the identification selecting signal IDsel. The comparator 230 is coupled to the detector 210 and the identification circuit 220 and configured to compare the identification selecting signal IDsel and the identification setting signal IDcon, and correspondingly provide the core enabling signal SCE based on the comparison.

To be specific, when the identification setting signal IDcon is equal to the identification selecting signal IDsel, the comparator 230 provides the enabled core enabling signal SCE; when the identification setting signal IDcon is different from the identification selecting signal IDsel, the comparator 230 provides the disabled core enabling signal SCE.

According to the present embodiment, the detectors (e.g., 210) of different memory dies (e.g., 110 and 120) provide the same identification selecting signal IDsel to the comparator (e.g., 230), and the identification circuits (e.g., 220) of different memory dies (e.g., 110 and 120) provide different predetermined identification setting signals IDcon to the comparator (e.g., 230). Hence, at one time, only one comparator 230 in all of the memory dies (e.g., 110 and 120) provides the enabled core enabling signal SCE.

FIG. 1 exemplarily shows two memory dies 110 and 120 which can be selected according to the voltage level of one single pin; that is, the identification selecting signal IDsel and the identification setting signal IDcon are one-bit digital signals. If the identification setting signal IDcon of the memory die 110 is assumed to be "0", the identification setting signal IDcon of the memory die 120 is "1". If the identification selecting signal IDsel is "0", the core circuit (e.g., 113) of the memory die 110 is activated, and the core circuit (e.g., 113) of the memory die 120 does not operate; if the identification selecting signal IDsel is "1", the core circuit (e.g., 113) of the memory die 120 is activated, and the core circuit (e.g., 113) of the memory die 110 does not operate.

Figure 3:
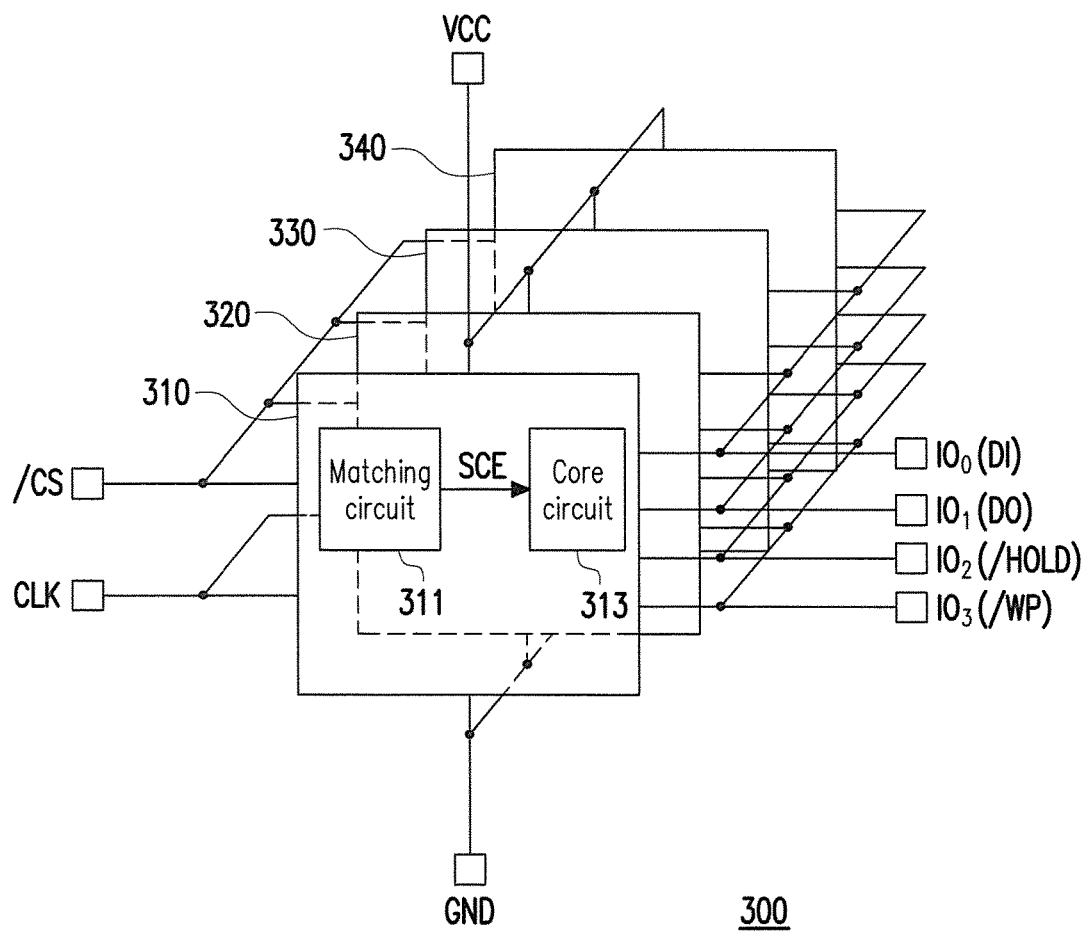
FIG. 3 is a schematic diagram illustrating a system of a memory device according to another embodiment of the invention.

FIG. 3 is a schematic diagram illustrating a system of a memory device according to another embodiment of the invention, wherein the same or similar components are represented by the same or similar reference numbers. With reference to FIG. 1 and FIG. 3, the memory device 300 is similar to the memory device 100, while the difference therebetween lies in that the memory device 300 has four vertically stacked memory dies 310, 320, 330, and 340. The descriptions of the matching circuit 331 and the core circuit 313 may be referred to as those of the matching circuit 111 and the core circuit 113 provided above and will not be repeated hereinafter.

Generally, four memory dies (e.g., 310, 320, 330, and 340) may be selected by two bits; namely, the memory dies (e.g., 310, 320, 330, and 340) may be selected according to the voltage levels of two pins. In other words, if the number of the memory dies (e.g., 310, 320, 330, and 340) is 4, the matching circuits (e.g., 311) of all of the memory dies (e.g., 310, 320, 330, and 340) provide the core enabling signal SCE based on the voltage levels of two of the first I/O pin $IO_0$, the second I/O pin $IO_1$, the third I/O pin $IO_2$, and the fourth I/O pin $IO_3$. After the core enabling signal SCE is provided, the matching circuit (e.g., 311) is automatically switched off (i.e., the matching circuit stops the detection) until the system is powered on again.

With reference to FIG. 2 and FIG. 3, if there are four memory dies (e.g., 310, 320, 330, and 340), the memory dies (e.g., 310, 320, 330, and 340) can be selected according to the voltage levels of two pins; that is, the identification selecting signal IDsel and the identification setting signal IDcon are two-bit digital signals.

If the identification setting signal IDcon of the memory die 310 is assumed to be "00", the identification setting signal IDcon of the memory die 320 is "01", the identification setting signal IDcon of the memory die 330 is "10", and the identification setting signal IDcon of the memory die 340 is "11".

If the identification selecting signal IDsel is "00", the core circuit (e.g., 313) of the memory die 310 is activated, and the core circuits (e.g., 313) of the memory dies 320, 330, and 340 do not operate; if the identification selecting signal IDsel is "01", the core circuit (e.g., 313) of the memory die 320 is activated, and the core circuits (e.g., 313) of the memory dies 310, 330, and 340 do not operate; if the identification selecting signal IDsel is "10", the core circuit (e.g., 313) of the memory die 330 is activated, and the core circuits (e.g., 313) of the memory dies 310, 320, and 340 do not operate; if the identification selecting signal IDsel is "11", the core circuit (e.g., 313) of the memory die 340 is activated, and the core circuits (e.g., 313) of the memory dies 310, 320, and 330 do not operate.

In the previous embodiment, the logic level of one bit is determined according to the voltage level of one pin; however, in another embodiment, the voltage level of one pin may be applied to determine the logic levels of two bits, which may be done according to the circuit design of the detector (e.g., 210). The number of stacked memory dies (e.g., 110, 120, 310, 320, 330, and 340) in the memory devices (e.g., 100 and 300) is preferably a power of 2, so as to ensure that at least one core circuit (e.g., 113 and 313) is activated after the system is powered on.

To sum up, the matching circuit in the memory device described in the embodiments of the invention provides the core enabling signal according to the voltage levels of the pins, so as to enable the core circuit in one of the memory dies. Thereby, the memory device can automatically activate one of the core circuits in no need of adding any pin.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A memory device comprising:
   a plurality of pins; and
   a plurality of memory dies, each of the memory dies being coupled to the plurality of pins and comprising:
   a matching circuit coupled to the plurality of pins, the matching circuit provides a core enabling signal based on a voltage level of at least one of the plurality of pins, wherein after the core enabling signal is provided, the matching circuit is automatically switched off until the memory device is powered on again; and
   a core circuit coupled to the plurality of pins and the matching circuit to receive the core enabling signal, wherein when the core enabling signal is enabled, the core circuit starts operating, and when the core enabling signal is disabled, the core circuit stops operating,
   wherein when the core circuit of one of the memory dies is operating, the core circuits of the rest of the memory dies stop operating.

2. The memory device according to claim 1, wherein the matching circuit comprises:
   a detector coupled to the plurality of pins to detect the voltage levels of the plurality of pins and provide an identification selecting signal based on the voltage level of at least one of the plurality of pins;
   an identification circuit configured to provide an identification setting signal; and
   a comparator coupled to the detector and the identification circuit and configured to compare the identification selecting signal and the identification setting signal and correspondingly provide the core enabling signal.

3. The memory device according to claim 2, wherein in the different memory dies, the identification circuit provides the different identification setting signals, and the detector provides the same identification selecting signal.

4. The memory device according to claim 2, wherein the plurality of pins comprise a power pin, a ground pin, a clock pin, a chip selecting pin, a first input/output pin, a second input/output pin, a third input/output pin, and a fourth input/output pin.

5. The memory device according to claim 4, wherein if the number of the memory dies is 2, the matching circuit provides the core enabling signal based on a voltage level of one of the first input/output pin, the second input/output pin, the third input/output pin, and the fourth input/output pin.

6. The memory device according to claim 4, wherein if the number of the memory dies is 4, the matching circuit provides the core enabling signal based on voltage levels of two of the first input/output pin, the second input/output pin, the third input/output pin, and the fourth input/output pin.

7. The memory device according to claim 4, wherein when a voltage level of the power pin is raised to a trigger voltage level, the matching circuit detects the voltage levels of the plurality of pins, so as to provide the core enabling signal.

8. The memory device according to claim 4, wherein after a voltage level of the power pin is raised to a trigger voltage level for a predetermined period of time, the matching circuit detects the voltage levels of the plurality of pins, so as to provide the core enabling signal.

9. The memory device according to claim 1, wherein the memory dies are vertically stacked.

10. The memory device according to claim 1, wherein the number of the memory dies is a power of 2.

11. The memory device according to claim 1, wherein the plurality of pins comprise a power pin, a ground pin, a clock pin, a chip selecting pin, a first input/output pin, a second input/output pin, a third input/output pin, and a fourth input/output pin.

* * * * *